(12) United States Patent
Lee et al.

(10) Patent No.: US 9,048,310 B2
(45) Date of Patent: *Jun. 2, 2015

(54) GRAPHENE SWITCHING DEVICE HAVING TUNABLE BARRIER

(71) Applicants: Samsung Electronics Co., Ltd., Suwon-Si, Gyeonggi-Do (KR); Seoul National University R & DB Foundation, Gwanak-gu, Seoul (KR)

(72) Inventors: Jae-ho Lee, Seoul (KR); Seong-jun Park, Seoul (KR); Kyung-eun Byun, Uijeongbu-si (KR); David Seo, Yongin-si (KR); Hyun-jae Song, Hwaseong-si (KR); Hyung-cheol Shin, Seoul (KR); Jae-hong Lee, Seoul (KR); Hyun-jong Chung, Hwaseong-si (KR); Jin-seong Heo, Seoul (KR)

(73) Assignees: SAMSUNG ELECTRONICS CO., LTD. (KR); SEOUL NATIONAL UNIVERSITY R & DB FOUNDATION (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/964,353

(22) Filed: Aug. 12, 2013

(65) Prior Publication Data
US 2014/0117313 A1    May 1, 2014

(30) Foreign Application Priority Data

Oct. 29, 2012   (KR) .................. 10-2012-0120611

(51) Int. Cl.
*H01L 29/02* (2006.01)
*H01L 29/78* (2006.01)
(52) U.S. Cl.
CPC ...................... *H01L 29/78* (2013.01)

(58) Field of Classification Search
CPC ............... H01L 21/02378; H01L 21/02447; H01L 29/872; H01L 29/1606; H01L 45/14; H01L 45/1246; H01L 45/1616
USPC ............... 257/29, E29.168, 255, E21, 645, 257/E45.002; 977/734, 814
See application file for complete search history.

(56) References Cited

U.S. PATENT DOCUMENTS 7,955,981 B2 *   6/2011  Chen et al. ................... 438/689
8,247,806 B2     8/2012  Chae et al.
(Continued)

FOREIGN PATENT DOCUMENTS

KR    20100111999 A    10/2010
KR    20110068838 A    6/2011
(Continued)

*Primary Examiner* — Michael Lebentritt
(74) *Attorney, Agent, or Firm* — Harness, Dickey & Pierce, PLC

(57) ABSTRACT

According to example embodiments, a graphene switching devices having a tunable barrier includes a semiconductor substrate that includes a first well doped with an impurity, a first electrode on a first area of the semiconductor substrate, an insulation layer on a second area of the semiconductor substrate, a graphene layer on the insulation layer and extending onto the semiconductor substrate toward the first electrode, a second electrode on the graphene layer and insulation layer, a gate insulation layer on the graphene layer, and a gate electrode on the gate insulation layer. The first area and the second area of the semiconductor substrate may be spaced apart from each other. The graphene layer is spaced apart from the first electrode. A lower portion of the graphene layer may contact the first well. The first well is configured to form an energy barrier between the graphene layer and the first electrode.

20 Claims, 6 Drawing Sheets

(56) References Cited

U.S. PATENT DOCUMENTS

| | | |
|---|---|---|
| 8,357,927 B2 | 1/2013 | Jang |
| 8,405,133 B2 | 3/2013 | Chung et al. |
| 8,742,400 B2 * | 6/2014 | Seo et al. .......... 257/29 |
| 8,785,912 B2 | 7/2014 | Chung et al. |
| 2010/0132773 A1 | 6/2010 | Lagally et al. |
| 2011/0220865 A1 * | 9/2011 | Miyata et al. .......... 257/12 |
| 2011/0291068 A1 | 12/2011 | Kobayashi |
| 2011/0309335 A1 | 12/2011 | Mehr et al. |
| 2013/0048951 A1 * | 2/2013 | Heo et al. .......... 257/29 |
| 2013/0277644 A1 * | 10/2013 | Seo et al. .......... 257/29 |
| 2013/0313522 A1 * | 11/2013 | Nourbakhsh et al. .......... 257/29 |
| 2014/0097404 A1 * | 4/2014 | Seo et al. .......... 257/29 |
| 2014/0191198 A1 * | 7/2014 | Kim et al. .......... 257/29 |

FOREIGN PATENT DOCUMENTS

| | | |
|---|---|---|
| KR | 20110101676 A | 9/2011 |
| KR | 20110115389 A | 10/2011 |
| KR | 20110132246 A | 12/2011 |
| KR | 20120022073 A | 3/2012 |
| KR | 20120029256 A | 3/2012 |

* cited by examiner

GRAPHENE SWITCHING DEVICE HAVING TUNABLE BARRIER

CROSS-REFERENCE TO RELATED APPLICATIONS

This application claims priority under 35 U.S.C. §119 to Korean Patent Application No. 10-2012-0120611, filed on Oct. 29, 2012, in the Korean Intellectual Property Office, the disclosure of which is incorporated herein in its entirety by reference.

BACKGROUND

1. Field

Example embodiments relate to graphene switching devices with an improved on-current.

2. Description of the Related Art

Graphene has a 2-dimensional hexagonal carbon structure. Graphene may replace some semiconductors in some electronic devices. Recently, worldwide studies about graphene have been conducted. In particular, graphene may be a zero gap semiconductor. To use graphene as a switching device, a band gap may need to be formed in graphene or a structure employing the graphene. A graphene device including the graphene may be the switching device.

When a graphene switching device is used as a diode, saturation may not occur during a forward bias application. Thus, it may be difficult to apply the graphene switching device to an analog circuit such as an amplifier if the diode does not have a maximum oscillation frequency due to a low output conductance. Meanwhile, although an output conductance may be good during a reverse bias application, since on-current is small, a transconductance may be reduced. Thus, a cut-off frequency may be low, which may make it difficult to apply the graphene switching device to a radio frequency (RF) circuit such as a low noise amplifier.

SUMMARY

Example embodiments relate to graphene switching devices having a tunable semiconductor barrier with an improved on-current characteristic.

Additional aspects will be set forth in part in the description which follows and, in part, will be apparent from the description, or may be learned by practice of example embodiments.

According to example embodiments, a graphene switching device having a tunable barrier includes: a semiconductor substrate including a first well doped with an impurity; a first electrode on a first area of the semiconductor substrate; an insulation layer on a second area of the semiconductor substrate; a graphene layer on the insulation layer, the graphene layer extending onto the semiconductor substrate towards the first electrode; a second electrode on the graphene layer and the insulation layer; a gate insulation layer on the graphene layer; and a gate electrode on the gate insulation layer. The first area and the second area of the semiconductor substrate are spaced apart from each other. The graphene layer and the first electrode are spaced apart from each other. The first well is configured to form an energy barrier between the graphene layer and the first electrode.

In example embodiments, a lower portion of the first electrode may contact the first well.

In example embodiments, a dopant concentration of the first well may be higher than a dopant concentration of an other portion of the semiconductor substrate.

In example embodiments, the semiconductor substrate may include one of silicon, germanium, silicon-germanium, III-V group semiconductor, II-VI semiconductor, semiconductor CNT, $MoS_2$, IZO, and GIZO.

In example embodiments, a gap between the first electrode and the graphene layer may be about 1 nm to about 30 nm.

In example embodiments, the energy barrier may be configured to vary based on a voltage applied to the gate electrode.

According to example embodiments, a graphene switching device having a tunable barrier includes: a semiconductor substrate including a first well doped with an impurity; a first electrode on a first area of the semiconductor substrate; an insulation layer on a second area of the semiconductor substrate; a plurality of metal particles on a surface of the semiconductor substrate between the first area and the second area; a graphene layer on the plurality of metal particles, the graphene layer extending onto the insulation layer and being spaced apart from the first electrode; a second electrode on the insulation layer with the graphene layer between the second electrode and the insulation layer; a gate insulation layer on the graphene layer; and a gate electrode on the gate insulation layer. A lower portion of the graphene layer contacts the first well. The first well is configured to form an energy barrier between the graphene layer and the first electrode.

In example embodiments, a lower portion of the first electrode may contact the first well.

In example embodiments, a dopant concentration of the first well may be higher than a dopant concentration of an other portion of the semiconductor substrate.

In example embodiments, the graphene switching device may further include an insulation material, and the insulation material may at least partially fill a plurality of grooves defined by an upper surface of the first well in the semiconductor substrate. The plurality of metal particles may be between the insulation material and the graphene layer.

In example embodiments, the plurality of grooves may be spaced apart from each other so portions of the first well extend between the plurality of grooves.

In example embodiments, the plurality of metal particles may be embedded in the insulation material, and top surfaces of the plurality of metal particles may contact the graphene layer.

In example embodiments, the plurality of metal particles may be on the insulation material such, top surfaces of the plurality of metal particles may contact the graphene layer.

In example embodiments, the graphene switching device may further include: an organic layer between the plurality of metal particles and the graphene layer.

In example embodiments, the organic layer may include an amino group, a hydroxyl group, and a hydrogen ion.

In example embodiments, the organic layer may have a thickness between about 1 nm and about 3 nm.

In example embodiments, each of the plurality of metal particles may have a size in a range of about 1 nm and about 10 nm.

In example embodiments, the plurality of metal particles may be spaced apart at intervals between about 10 nm and about 30 nm.

According to example embodiments, a graphene switching device having a tunable barrier includes: a semiconductor substrate including a first well doped with one of an n-type impurity and a p-type impurity; a first electrode, a gate electrode, and a second electrode spaced apart from each other on the semiconductor substrate; an insulating layer between the second electrode and the substrate; a graphene layer between the second electrode and the insulating layer; and a gate insulating layer between the graphene layer and the gate electrode. The graphene layer extends over a part of the first well. The graphene layer is spaced apart from the first electrode. The first well is configured to form an energy barrier between the graphene layer and the first electrode.

In example embodiments, the graphene layer may include a lower portion that extends parallel over the part of the first well.

In example embodiments, the graphene switching device may further include a plurality of metal particles and an insulation material. An upper surface of the first well may define a plurality of grooves that are spaced apart from each other. The insulation material may at least partially fill the plurality of grooves. The plurality of metal particles may be between the insulation material and the graphene layer.

In example embodiments, the plurality of metal particles may be embedded in the insulation material.

In example embodiments, the graphene layer may include a thickness of a single layer to four layers. A gap between the first electrode and the graphene layer may be about 1 nm to about 30 nm. A concentration of the one of an n-type impurity and a p-type impurity in the first well may be about $10^{19}$ atoms/cm$^3$ and $10^{21}$ atoms/cm$^3$.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
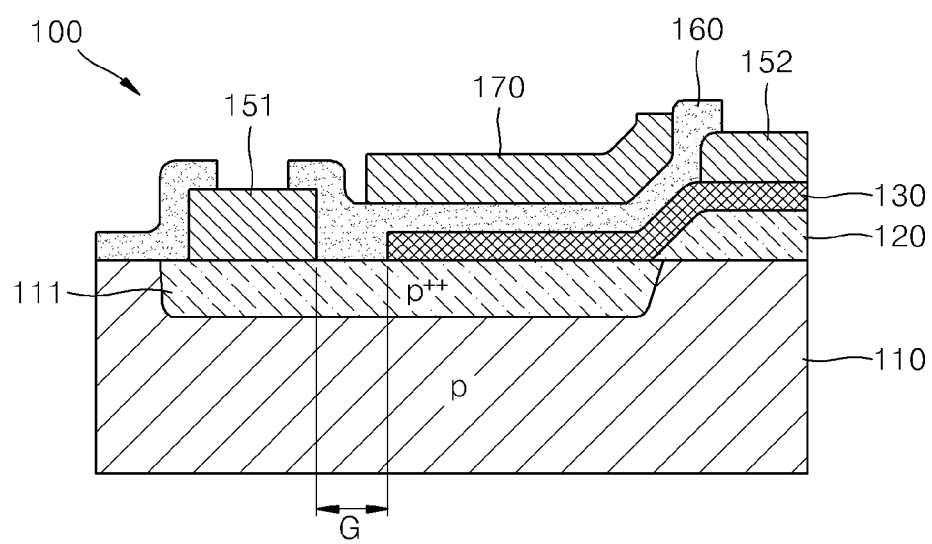
FIG. 1 is a schematic cross-sectional view of a graphene switching device including a tunable barrier according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a graphene switching device 100 including a tunable barrier according to example embodiments.

Referring to FIG. 1, a first electrode 151 is disposed on a first area of a substrate 110. An insulation layer 120 may be on a second area of the substrate 110 that is spaced apart from the first area. A graphene layer 130 is spaced apart from the first electrode 151 between the first area and the second area on the substrate 110 to extend onto the insulation layer 120. A gap G between the graphene layer 130 and the first electrode 151 may be between about 1 nm to about 30 nm. A second electrode 152 is formed on the second area to face the insulation layer 120 with the graphene layer 130 therebetween. A gate insulation layer 160 that covers a part of the graphene layer 130 is formed on the substrate 110. A gate electrode 170 is formed on the gate insulation layer 160.

The first electrode 151 and the second electrode 152 may be formed of metal or polysilicon.

The substrate 110 may be a semiconductor substrate and may be conductive. The substrate 110 may be formed of silicon, germanium, silicon-germanium, III-V group semiconductor, II-VI semiconductor, semiconductor CNT, $MoS_2$, IZO, and GIZO. The substrate 110 may be doped with an n-type impurity or a p-type impurity. As shown in FIG. 1, the substrate 110 may be a semiconductor doped with the p-type impurity. The graphene layer 130 may be between semiconductor substrate 110 and the gate electrode 170. Thus, an energy band of the semiconductor substrate 110 may be influenced by a gate voltage applied to the gate electrode 170. Thus, the substrate 110 may be a tunable barrier and may be referred to as a semiconductor barrier.

A first well 111 may be formed in the substrate 110. The first well 111 may extend from a lower portion of the graphene layer 130 to a lower portion of the first electrode 151, and may contact the graphene layer 130 and the first electrode 151. The first well 111 may be doped at a higher concentration than a concentration that the substrate 110 may be doped. For example, in a case where the substrate 110 is p-doped as shown in FIG. 1, the first well 111 may be a p++ area. The first well 111 may be an area having an impurity concentration of between about $10^{19}$ atoms/$cm^3$ and about $10^{21}$ atoms/$cm^3$. In a case where the impurity concentration of the first well 111 is less than $10^{19}$ atoms/$cm^3$, an on-current enhancement effect may be reduced (see FIG. 4). The graphene switching device 100 may be a uni-polar transistor that becomes an n-type transistor or a p-type transistor according to a polarity of the first well 111 in which the semiconductor barrier is formed. That is, if the first well 111 is doped with the p-type impurity, the graphene switching device 100 having the tunable barrier may be the p-type transistor. The first electrode 151 and the second electrode 152 may be a drain electrode and a source electrode, respectively. The graphene layer 130 may function as a channel. Meanwhile, if the first well 111 is doped with the n-type impurity, the graphene switching device 100 having the tunable barrier may be the n-type transistor. In this regard, the first well 111 may be an n++ area.

The gate insulation layer 160 may be formed of a dielectric material such as silicon oxide or silicon nitride, but example embodiments are not limited thereto.

The graphene layer 130 may be formed by a chemical vapor deposition (CVD) method, then transferring the graphene onto the substrate 110 and patterning the graphene. The graphene layer 130 may include a thickness that includes a single layer to four layers of graphene. The graphene layer may include a thickness of one to four carbon atoms. The graphene layer 130 may be a moving path of carriers and may have a zero band gap.

Figure 2:
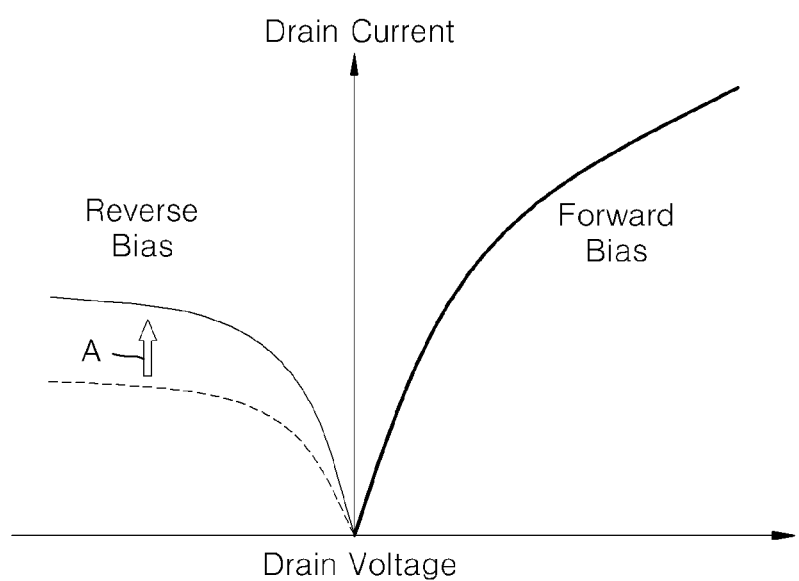
FIG. 2 is a schematic graph for showing an I-V characteristic of a graphene switching device including a tunable barrier according to example embodiments.

FIG. 2 is a schematic graph showing an I-V characteristic of a graphene switching device including a tunable barrier according to example embodiments.

Referring to FIG. 2, in a p-type graphene switching device, current flows well when a positive drain voltage is applied, whereas current does not relatively flow well when a negative drain voltage is applied. That is, the p-type graphene switching device may have a diode characteristic.

Meanwhile, when the positive drain voltage that is a forward voltage is applied, a drain current may not be saturated, whereas, when the negative drain voltage that is a reverse voltage is applied, the drain current may be saturated. However, when the reverse voltage is applied, an on-current is small, which makes it difficult to apply the p-type graphene switching device to an RF circuit.

Meanwhile, in a graphene switching device according to example embodiments, when the reverse voltage is applied, a flow of a carrier that flows from a graphene layer to a first electrode may be good due to the first well 111 shown in FIG. 1, and thus the on-current may be improved as indicated as an arrow A of FIG. 2. Thus, a graphene switching device according to example embodiments may be applied to the RF circuit.

Figure 3A:
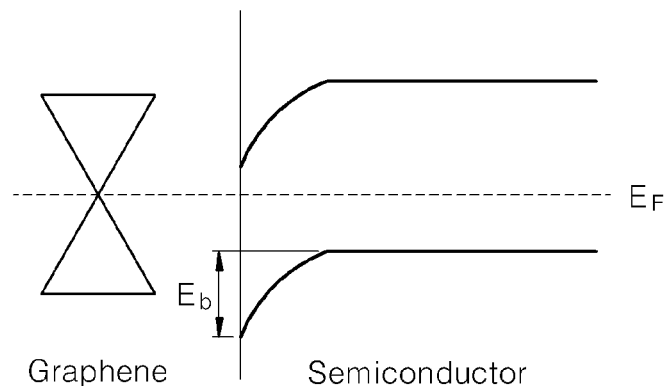
FIGS. 3A and 3B are energy band diagrams for explaining an operation of the graphene switching device of FIG. 1 when a first well is a p++ area, according to example embodiments.
Figure 3B:
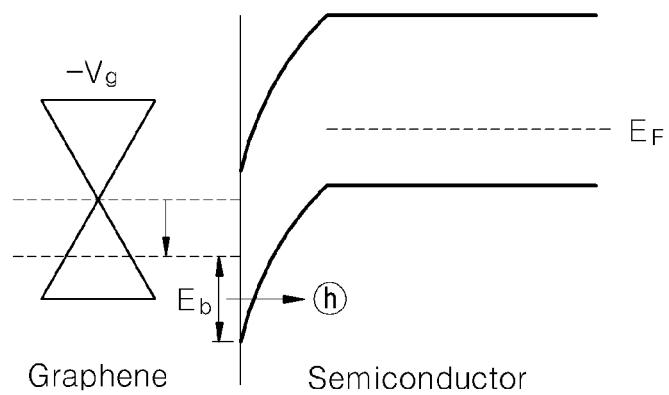

FIGS. 3A and 3B are energy band diagrams for explaining an operation of the graphene switching device 100 of FIG. 1, according to example embodiments.

FIG. 3A shows a state where a drain voltage and a gate voltage are not applied. FIG. 3B shows a state where the drain voltage and the gate voltage are applied.

Referring to FIG. 3A, in the state where drain voltage and gate voltage are not applied, energy band structures corresponding to respective work functions of the first well 111 of the p-type semiconductor substrate 110 and the graphene layer 130 are formed. The graphene switching device 100 includes the p-type semiconductor substrate 110, and thus main carriers are holes. An energy barrier between the first electrode 151 and the graphene layer 130 may be formed in the first well 111 of the semiconductor substrate 110. The semiconductor substrate 110 may also be referred to as a semiconductor barrier or a Schottky barrier. The mobilization of the carriers may be restricted by an energy barrier Eb between the graphene layer 130 and the semiconductor substrate 110. In FIGS. 3A and 3B, $E_F$ indicates Fermi energy level of the graphene layer 130.

Referring to FIG. 3B, if a negative voltage is applied to the first electrode 151, a reverse bias voltage is applied between source and drain, and thus an energy barrier increases, whereas a thickness of the energy barrier is reduced.

If a desired (and/or alternatively predetermined) negative gate voltage −Vg is applied to the gate electrode 170, the Fermi energy level of the graphene layer 130 moves downward as indicated as an arrow so that the energy barrier Eb between the graphene layer 130 and the semiconductor substrate 110 may be reduced. In this regard, a tunneling thickness may also be reduced. Thus, tunneling of holes from the graphene layer 130 to the semiconductor substrate 110 may be facilitated.

Meanwhile, as the doping concentration of the first well 111 increases, a depletion area may be reduced, and the width of the energy barrier Eb may be reduced. If the doping concentration increases, a tunneling current may increase due to the reduction in the width of the energy barrier Eb. Thus, an on-current may increase.

The energy barrier Eb between the graphene layer 130 and the semiconductor substrate 110 may be adjusted according to magnitude of a gate voltage. Accordingly, the semiconductor substrate 110 may be referred to as a tunable barrier.

Figure 3C:
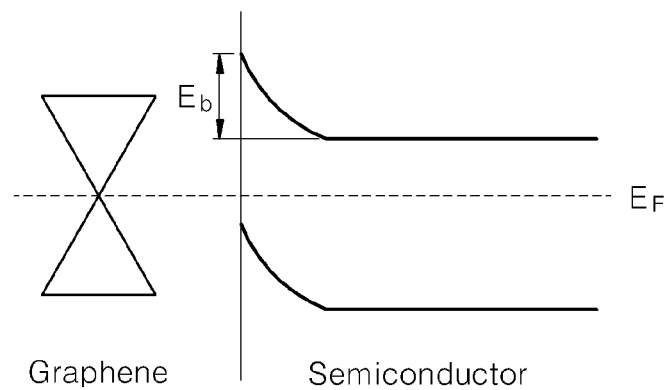
FIGS. 3C and 3D are energy band diagrams for explaining an operation of the graphene switching device of FIG. 1 when a first well is an n++ area, according to example embodiments.
Figure 3D:
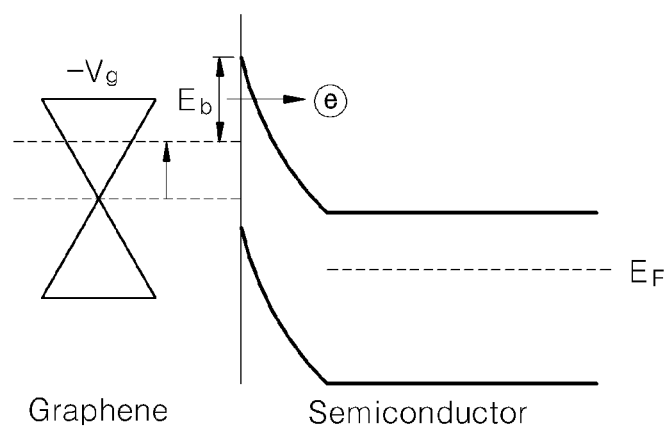

FIGS. 3C and 3D are energy band diagrams for explaining an operation of the graphene switching device 100 of FIG. 1 when the first well 111 is an n++ area, according to example embodiments.

FIG. 3C shows a state where a drain voltage and a gate voltage are not applied. FIG. 3D shows a state where the drain voltage and the gate voltage are applied.

Referring to FIG. 3C, in the state where drain voltage and gate voltage are not applied, energy band structures corresponding to respective work functions of the n-type first well 111 and the graphene layer 130 are formed. Main carriers of the graphene switching device 100 are electrons. An energy barrier between the first electrode 151 and the graphene layer 130 may be formed in the first well 111 of the semiconductor substrate 110. The first well 111 of the semiconductor substrate 110 may also referred to as a semiconductor barrier. The mobilization of the carriers may be restricted by an energy barrier Eb between the first well 111 and the graphene layer 130. In FIGS. 3C and 3D, $E_F$ indicates Fermi energy level of the graphene layer 130.

Referring to FIG. 3D, if a negative voltage is applied to the second electrode 152, a reverse bias voltage may be applied between source and drain, and thus an energy barrier may increase, whereas a thickness of the energy barrier may be reduced.

If a desired (and/or alternatively predetermined) positive gate voltage +Vg is applied to the gate electrode 170, the Fermi energy level of the graphene layer 130 may move upward as indicated by the arrow in FIG. 3D so that the energy barrier Eb between the first well 111 and the graphene layer 130 may be reduced. In this regard, a tunneling thickness may also be reduced. Thus, tunneling of electrons from the graphene layer 130 to the first well 111 of the semiconductor substrate 110 may be facilitated.

The energy barrier Eb between the first well 111 and the graphene layer 130 may be adjusted according to magnitude of a gate voltage, and thus the energy barrier Eb of the graphene switching device 100 may be adjusted. Accordingly, the semiconductor substrate 110 may be referred to as a tunable barrier.

Figure 4:
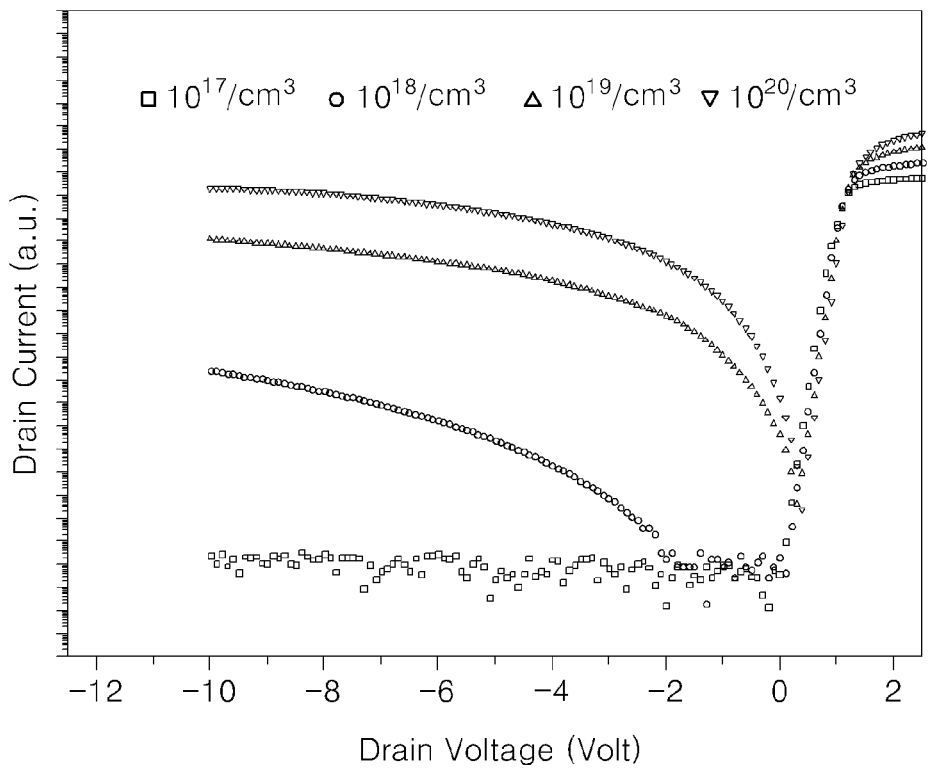
FIG. 4 is a simulation graph showing a variation of a drain current with respect to a variation of a doping concentration of a first well of a graphene switching device, according to example embodiments.

FIG. 4 is a simulation graph of a variation of a drain current with respect to a variation of a doping concentration of a first well of a graphene switching device, according to example embodiments.

Referring to FIG. 4, when a negative drain voltage that is a reverse voltage is applied, the drain current increases by increasing a doping concentration of a well (111 of FIG. 1) of a p-type substrate from about $10^{17}$ atoms/cm$^3$ to about $10^{20}$ atoms/cm$^3$. That is, on-current increases.

Although the graphene switching device includes the p-type well in FIG. 1, example embodiments are not limited thereto. For example, according to example embodiments, a graphene switching device may alternatively include an n-type well, and a detailed description thereof is omitted.

Figure 5:
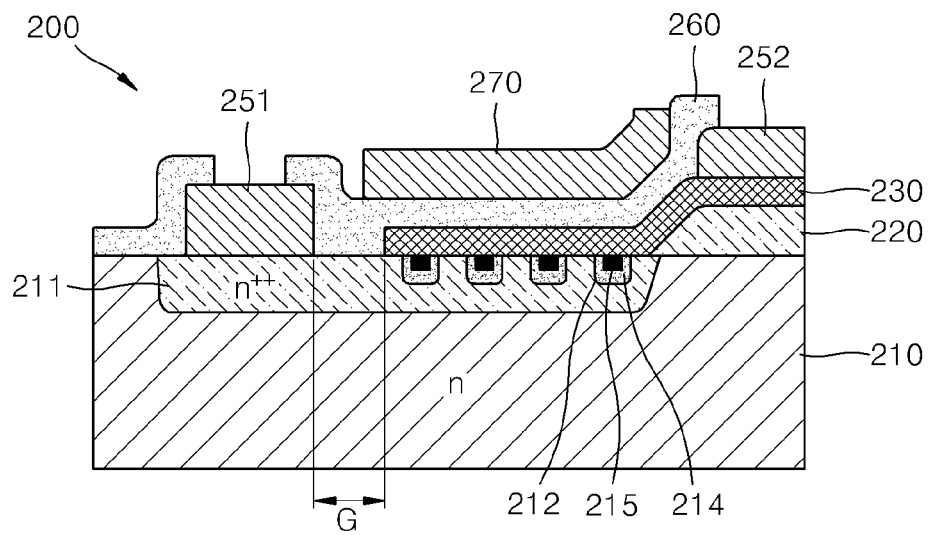
FIG. 5 is a schematic cross-sectional view of a graphene switching device including a tunable barrier according to example embodiments.

FIG. 5 is a schematic cross-sectional view of a graphene switching device 200 including a tunable barrier according to example embodiments.

Referring to FIG. 5, a first electrode 251 is disposed on a first area of a semiconductor substrate 210. An insulation layer 220 is formed on a second area spaced apart from the first area. A graphene layer 230 extends from a third area between the first area and the second area onto the insulation layer 220. The graphene layer 230 is spaced apart from the first electrode 251. The gap G between the graphene layer 230 and the first electrode 251 may be between about 1 nm and about 30 nm. A second electrode 252 is formed in the second area to face the insulation layer 220 with the graphene layer 230 therebetween.

Although the insulation layer 220 is formed on a surface of the semiconductor substrate 210 in FIG. 5, example embodiments are not limited thereto. For example, an insulation layer may alternatively be formed by oxidizing the surface of the semiconductor substrate 210.

A plurality of grooves 212 are defined by an upper surface of the first well 211 in the semiconductor substrate 210. Metal particles 215 are in the grooves 212. The metal particles 215 may contact the graphene layer 230. An insulation material 214 may be formed in each of the groove 212. The insulation material 214 may surround a corresponding metal particle 215 to reduce (and/or prevent) the metal particles 215 from contacting the semiconductor substrate 210. The metal particles 215 may be formed of Pt, Au, Pd, Co, Y, Gd, Ca, and Ti. Each of the metal particles 215 may have a size between about 1 nm and about 10 nm. The metal particles 215 may be formed at an interval between about 10 nm and about 30 nm. However, example embodiments are not limited thereto.

The grooves 212 may be relatively long trenches. In this case, the metal particles 215 may have an aspect ratio of 1:10.

A first well 211 in the semiconductor substrate 210 may extends from a lower portion of the graphene layer 230 to a lower portion of the first electrode 251, and contact the graphene layer 230 and the first electrode 251. The first well 211 may be formed to define the grooves 212.

The first well 211 may be doped at a higher concentration than the semiconductor substrate 210. For example, in a case where the semiconductor substrate 210 is n-doped as shown in FIG. 5, the first well 211 is an n++ area. The first well 211 may be an area having an impurity concentration of between about $10^{19}$ atoms/cm$^3$ and about $10^{21}$ atoms/cm$^3$. The semiconductor substrate 210 may be p-doped. The graphene switching device 200 may be a uni-polar transistor that becomes an n-type transistor or a p-type transistor according to a polarity of the first well 211 in which a semiconductor barrier is formed. That is, if the first well 211 is doped with an n-type impurity, as shown in FIG. 5, the graphene switching device 200 having the tunable barrier is the n-type transistor. The first electrode 251 and the second electrode 252 may be a drain electrode and a source electrode, respectively. The graphene layer 230 may function as a channel. Meanwhile, if the first well 211 is doped with a p-type impurity, the graphene switching device 200 having the tunable barrier is the p-type transistor. In this regard, the first well 211 may be a p++ area.

A gate insulation layer 260 that covers a part of the graphene layer 230 may be formed on the substrate 210. The gate electrode 270 may be formed on the gate insulation layer 260.

The first electrode 251 and the second electrode 252 may be formed of metal or polysilicon.

The substrate 210 may be a semiconductor substrate and may be conductive. The substrate 210 may be formed of silicon, germanium, silicon-germanium, III-V group semiconductor, II-VI semiconductor, 2D semiconductor, $MoS_2$, IZO, and GIZO that is a single layer. The substrate 210 may be doped with the n-type impurity or the p-type impurity. As shown in FIG. 5, the substrate 210 may be a semiconductor doped with the n-type impurity. The graphene layer 230 may be between the gate electrode 270 and the substrate 210. Thus, an energy band of the semiconductor substrate 210 is influenced by a gate voltage applied to the gate electrode 270.

The gate insulation layer 260 may be formed of a dielectric material such as silicon oxide or silicon nitride, but example embodiments are not limited thereto.

The graphene layer 230 may be formed by a CVD method on the substrate 210, then transferring the graphene onto the substrate 110 and patterning the graphene. The graphene layer 230 may include a thickness that includes a single layer to four layers of graphene. The graphene may include a thickness of one to four carbon atoms. The graphene layer 230 may be a moving path of carriers and may have a zero band gap.

Figure 6:
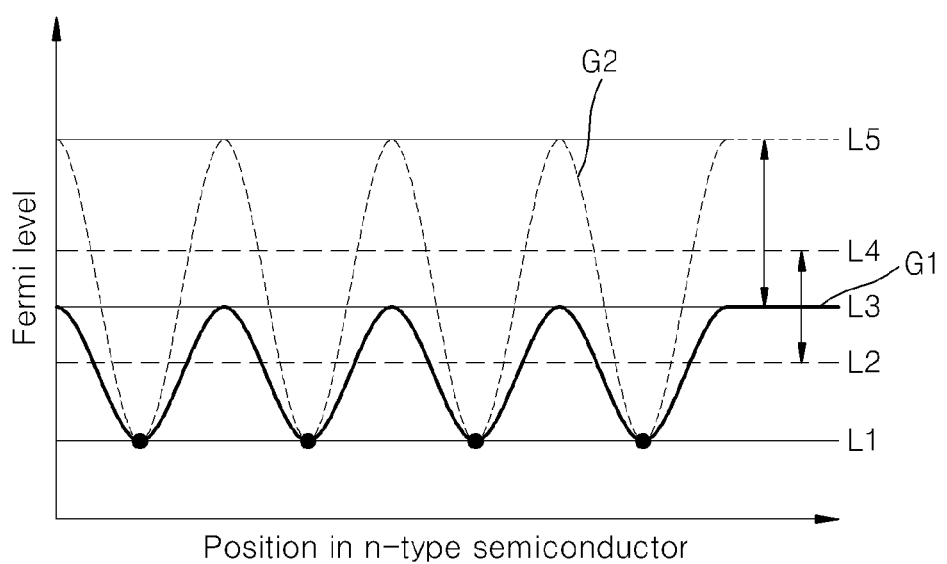
FIG. 6 is a graph for explaining an operation of metal particles of the graphene switching device of FIG. 5.

FIG. 6 is a graph for explaining an operation of the metal particles 215 of the graphene switching device 200 of FIG. 5. In FIG. 6, black circles indicate the metal particles 215. In a case where the first well 211 of the semiconductor substrate 210 is doped with an n-type impurity, and the metal particles 215 are formed of metals having a higher work function than silicon, a Fermi level of the graphene layer 230 at locations of the metal particles 215 are fixed to a level 1 L1 that is a Fermi level of the metal particles 215 and is lower than a level 3 L3 that is the Fermi level of the graphene layer 230. Thus, as indicated by a first graph G1, the Fermi level of the graphene layer 230 may be expressed in a curve between the Fermi level L1 of the metal particles 215 and the Fermi level L3 of the graphene layer 230. A level 2 L2 is an average Fermi level of the graphene layer 230 in a state where a gate voltage is not applied.

As a positive gate voltage is applied to the gate electrode 270, the Fermi level of the graphene layer 230 increases to a level 5 L5 so that a height of a curve between the Fermi level L1 of the metal particles 215 and the Fermi level L5 of the graphene layer 230 increases as indicated by a second graph G2. A level 4 L4 is an average Fermi level of the graphene layer 230 in a state where the positive gate voltage is applied.

Therefore, a driving current may vary between the level 3 L3 and the level 5 L5 in a graphene switching device that does not have the metal particles 215, whereas the driving current may vary between the level 2 L2 and the level 4 L4 in the graphene switching device 200 having the metal particles 215. Magnitude of the driving current may be reduced due to the metal particles 215, and thus an operating power of the graphene switching device 200 may also be reduced.

In a case where the first well 211 of the semiconductor substrate 210 is doped with, for example, a p-type impurity, and the metal particles 215 are formed of metals having a lower work function than silicon, magnitude of the driving current may also be reduced, and thus the operating power of the graphene switching device 200 may also be reduced. A detailed description in this regard is omitted.

The operation of an n-type graphene switching device of FIG. 5 is described above with reference to FIGS. 3C and 3D, and thus a detailed description thereof is omitted.

Although the first well 211 is doped with the n-type impurity in the graphene switching device 200 according to example embodiments described in FIGS. 5 and 6, example embodiments are not limited thereto. For example, the first well 211 may be doped with the p-type impurity and the first well 211 may be doped at a higher p-type impurity concentration than a p-type impurity concentration of the substrate 210, and an operation thereof is described previously with reference to FIGS. 3A and 3B, and thus a detailed description thereof is omitted.

Figure 7:
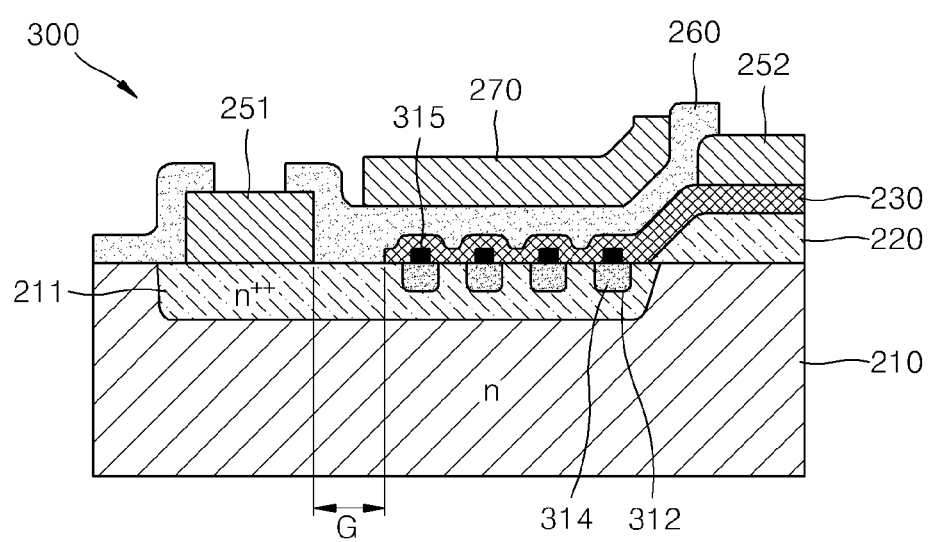
FIG. 7 is a schematic cross-sectional view of a graphene switching device having a tunable barrier according to example embodiments.

FIG. 7 is a schematic cross-sectional view of a graphene switching device 300 according to example embodiments. The same reference numerals denote the same elements between the graphene switching device 200 and the graphene switching device 300. Thus, detailed descriptions thereof are omitted.

Referring to FIG. 7, a plurality of grooves 312 are defined by an upper surface of the semiconductor substrate 210. An insulation material 314 may fill the grooves 312. Metal particles 315 may be on the insulation material 314 and contact the graphene layer 230. The graphene layer 230 may surround the metal particles 315 and contact the first well 211 of the semiconductor substrate 210. The metal particles 315 may be formed of Pt, Au, Pd, Co, Y, Gd, Ca, and Ti. Each of the metal particles 315 may have a size between about 1 nm and about 10 nm. The metal particles 315 may be formed at an interval between about 10 nm and about 30 nm. However, example embodiments are not limited thereto.

The gate insulation layer 260 may cover a part of the graphene layer 230 that is on the first well 211 of the semiconductor substrate 210. The gate electrode 270 may be formed on the gate insulation layer 260.

The first well 211 may be formed in the semiconductor substrate 210 and extend from a lower portion of the graphene layer 230 to a lower portion of the first electrode 251, and contact the graphene layer 230 and the first electrode 251. The first well 211 may define the grooves 312.

The first well 211 may be doped at a higher concentration than the semiconductor substrate 210. For example, in a case where the semiconductor substrate 210 is n-doped as shown in FIG. 7, the first well 211 is an n++ area. However, the semiconductor substrate 210 and the first well 211 may alternatively be p-doped. The graphene switching device 200 may be a uni-polar transistor that becomes an n-type transistor or a p-type transistor according to a polarity of the first well 211 in which a semiconductor barrier is formed. That is, if the first well 211 is doped with an n-type impurity as shown in FIG. 7, the graphene switching device 300 having a tunable barrier may be an n-type transistor. Meanwhile, if the first well 211 is doped with a p-type impurity, the graphene switching device 300 having the tunable barrier is a p-type transistor. In this regard, the first well 211 may be a p++ area.

As described above, in example embodiments, a graphene switching device may have a diode characteristic, and, when a reverse bias voltage is applied, a graphene switching device according to example embodiments may be improved in terms of on-current, and thus one or more graphene switching devices according to example embodiments may be applied to an RF circuit.

While some example embodiments have been particularly shown and described, it will be understood by one of ordinary skill in the art that variations in form and detail may be made therein without departing from the spirit and scope of the claims.

What is claimed is:

1. A graphene switching device having a tunable barrier, the graphene switching device comprising:
   a semiconductor substrate,
     the semiconductor substrate including a first well doped with an impurity;
   a first electrode on a first area of the semiconductor substrate;

an insulation layer on a second area of the semiconductor substrate,
the first area and the second area being spaced apart from each other;
a graphene layer on the insulation layer,
the graphene layer extending onto the semiconductor substrate toward the first electrode,
the graphene layer being spaced apart from the first electrode,
the graphene layer including a lower portion that contacts the first well of the semiconductor substrate,
the first well being configured to form an energy barrier between the graphene layer and the first electrode;
a second electrode on the graphene layer and the insulation layer;
a gate insulation layer on the graphene layer; and
a gate electrode on the gate insulation layer.

2. The graphene switching device of claim 1, wherein a lower portion of the first electrode contacts the first well.

3. The graphene switching device of claim 1, wherein a dopant concentration of the first well is higher than a dopant concentration of an other portion of the semiconductor substrate.

4. The graphene switching device of claim 1, wherein the semiconductor substrate includes one of silicon, germanium, silicon-germanium, III-V group semiconductor, II-VI semiconductor, semiconductor CNT, $MoS_2$, IZO, and GIZO.

5. The graphene switching device of claim 1, wherein a gap between the first electrode and the graphene layer is about 1 nm to about 30 nm.

6. The graphene switching device of claim 1, wherein the energy barrier is configured to vary based on a voltage applied to the gate electrode.

7. A graphene switching device having a tunable barrier, the graphene switching device comprising:
a semiconductor substrate,
the semiconductor substrate including a first well doped with an impurity;
a first electrode on a first area of the semiconductor substrate;
an insulation layer on a second area of the semiconductor substrate;
a plurality of metal particles on a surface of the semiconductor substrate between the first area and the second area;
a graphene layer on the plurality of metal particles,
the graphene layer extending onto the insulation layer,
the graphene layer being spaced apart from the first electrode,
the graphene layer including a lower portion that contacts the first well,
the first well configured to form an energy barrier between the graphene layer and the first electrode;
a second electrode on the insulation layer,
the graphene layer between the second electrode and insulation layer;
a gate insulation layer on the graphene layer; and
a gate electrode on the gate insulation layer.

8. The graphene switching device of claim 7, wherein a lower portion of the first electrode contacts the first well.

9. The graphene switching device of claim 7, wherein a dopant concentration of the first well is higher than a dopant concentration of an other portion of the semiconductor substrate.

10. The graphene switching device of claim 7, further comprising:
an insulation material, wherein
an upper surface of the first well defines a plurality of grooves,
the insulation material at least partially fills each of the plurality of grooves, and
the plurality of metal particles are between the insulation material and the graphene layer.

11. The graphene switching device of claim 10, wherein the plurality of grooves are spaced apart from each other so portions of the first well extend between the plurality of grooves.

12. The graphene switching device of claim 10, wherein the plurality of metal particles are embedded in the insulation material, and
top surfaces of the plurality of metal particles contact the graphene layer.

13. The graphene switching device of claim 10, wherein the plurality of metal particles are on the insulation material, and
top surfaces of the plurality of metal particles contact the graphene layer.

14. The graphene switching device of claim 7, wherein each of the plurality of metal particles has a size in a range of about 1 nm and about 10 nm.

15. The graphene switching device of claim 14, wherein the plurality of metal particles are spaced apart at intervals between about 10 nm and about 30 nm.

16. The graphene switching device of claim 7, wherein the semiconductor substrate includes one of silicon, germanium, silicon-germanium, III-V group semiconductor, II-VI semiconductor, semiconductor CNT, $MoS_2$, IZO, and GIZO.

17. The graphene switching device of claim 7, wherein a gap between the first electrode and the graphene layer is about 1 nm to about 30 nm.

18. The graphene switching device of claim 7, wherein the energy barrier is configured to vary based on a voltage applied to the gate electrode.

19. A graphene switching device having a tunable barrier, the graphene switching device comprising:
a semiconductor substrate,
the semiconductor substrate including a first well doped with one of an n-type impurity and a p-type impurity;
a first electrode, a gate electrode, and a second electrode spaced apart from each other on the semiconductor substrate;
an insulating layer between the second electrode and the substrate;
a graphene layer between the second electrode and the insulating layer,
the graphene layer extending over a part of the first well,
the graphene layer being spaced apart from the first electrode,
the first well being configured to form an energy barrier between the graphene layer and the first electrode; and
a gate insulating layer between the graphene layer and the gate electrode.

20. The graphene switching device of claim 19, further comprising:
a plurality of metal particles;
an insulation material, wherein
an upper surface of the first well defines a plurality of grooves that are spaced apart from each other,
the insulation material at least partially fills the plurality of grooves, and the plurality of metal particles are between the insulation material and the graphene layer.

* * * * *